United States Patent [19]

Nishino

[11] Patent Number: 5,289,349
[45] Date of Patent: Feb. 22, 1994

[54] INTEGRATED CIRCUIT CARD

[75] Inventor: Tomoki Nishino, Kanagawa, Japan

[73] Assignee: Sony Corporation, Tokyo, Japan

[21] Appl. No.: 868,475

[22] Filed: Apr. 14, 1992

[30] Foreign Application Priority Data

Apr. 15, 1991 [JP] Japan .................................. 3-111128

[51] Int. Cl.⁵ .............................................. H05K 7/06
[52] U.S. Cl. ...................................... 361/813; 235/492
[58] Field of Search ....................... 361/395, 400, 401; 29/848, 856; 235/492

[56] References Cited

U.S. PATENT DOCUMENTS 5,018,051  5/1991  Yamada et al. ................. 361/401 X Primary Examiner—Eugene F. Desmond
Attorney, Agent, or Firm—Philip M. Shaw, Jr.

[57] ABSTRACT

Disclosed is an IC card comprising a plurality of semi-conductor IC chips and a plurality of lead wires acting as the terminals for connectin,o the electrodes of the semiconductor IC chips to the outside. The semiconductor IC chips and the lead wires are integrally sealed in a plastic board. This construction provides a significantly thin IC card of high reliability at low cost.

3 Claims, 2 Drawing Sheets

INTEGRATED CIRCUIT CARD

BACKGROUND OF THE INVENTION:

1. Field of the Invention

The present invention relates to an integrated circuit (IC) card and, more particularly, to an IC card incorporating a plurality of semiconductor integrated circuit chips.

2. Description of the Prior Art

There exist a number of prior art card type portable semiconductor storage apparatuses. One such prior art storage apparatus involves a circuit board of glass-reinforced epoxy or like material containing copper wiring. The circuit board is furnished with semicondiictor integrated circuits (IC's) such as semiconductor storage and control devices, the circuits being plastic-sealed by injection molding. The semiconductor IC's are attached to the circuit board by soldering the leads of the former to the latter. The circuit board is further provided with connectors for electrical connection to an external data processing apparatus. The semiconductor IC's such as semiconductor storage and control devices as well as the circuit board are put in a suitable case for mechanical protection from the outside.

Another prior art card type portable semiconductor storage apparatus involves a circuit board mounted with bare semiconductor IC chips containing semiconductor storage and control devices and the like. Metal wires are used to connect the electrodes of the chips to the wiring layer of the circuit board (called wire bonding). The semiconductor IC chips are potted each and are furnished with connectors. The whole circuit board assembly is placed in an appropriate case.

A further prior art card type portable semiconductor storage apparatus involves a circuit board mounted with bare semiconductor IC chips havinu their projected electrodes connected to the circuit board not by wire binding but by direct alloy junction.

One disadvantage of the above-mentioned prior art IC cards is the growinla number of parts needed to attach numerous connectors and related components. The attaching of the connectors necessitates complicated assembling processes. The result is a sionificant increase in production cost.

The prior art IC card containin, plastic-sealed semiconductor storage and control devices offers higher levels of reliability and quality than the IC card containing bare-chip semiconductor storage and control devices. However, the former prior art IC card when put in a case is unfit for getting reduced in thickness.

Another problem with the prior art IC card containing plastic-sealed semiconductor storage and control devices is as follows. Because the IC's of the plastic-sealed semiconductor storage and control devices are soldered to the circuit board, reflow soldering is mandatory. During the process, the moisture contained in the plastic may evaporate under heat, causing cracks to develop in the plastic. More specifically, the plastic that seals the semiconductor IC chips has hyolroscopic property and thus contains moisture. Abrupt heating durin, the reflow soldering process causes the moisture to evaporate. The expansion resulting from the evaporation can produce cracks in the sealine plastic.

The IC card containing bare-chip semiconductor storage and control devices is more conducive to thinner card form than the IC card containing plastic-sealed semiconductor storage and control devices, but is inferior to the latter in terms of quality and reliability. That is, the potted sealing plastic tends to be brittle under partial stress concentration. Moreover, the IC card containing bare-chip semiconductor storage and control devices is basically inferior in mechanical strength to the IC card containing plastic-sealed semiconductor storage and control devices.

SUMMARY OF THE INVENTION

It is therefore an object of the present invention to provide an integrated circuit (.IC.) card which is assembled in the same processes using the same parts as ordinary semiconductor IC's at lower cost, which has a substantially thin card form but retains sufficient mechanical strength, and which offers hich levels of quality and reliability.

In carrying out the invention and according to one aspect thereof, there is provided an IC card comprising a plurality of semiconductor IC chips and a plurality of lead wires actin, as the terminals for connecting the electrodes of the semiconductor IC chips to the outside, wherein the semiconductor IC chips and the lead wires are integrally sealed in a plastic board.

Further objects, features and advantages of the invention will become more apparent upon a reading of the following description and appended drawings.

DESCRIPTION OF THE PREFERRED EMBODIMENT

Figure 1:
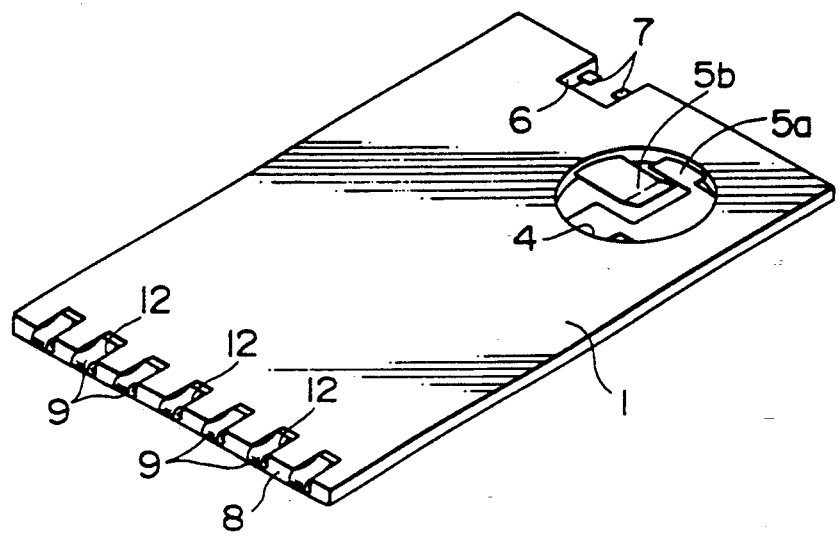
FIG. 1 is a perspective view of an IC card embodying the present invention.
Figure 2:
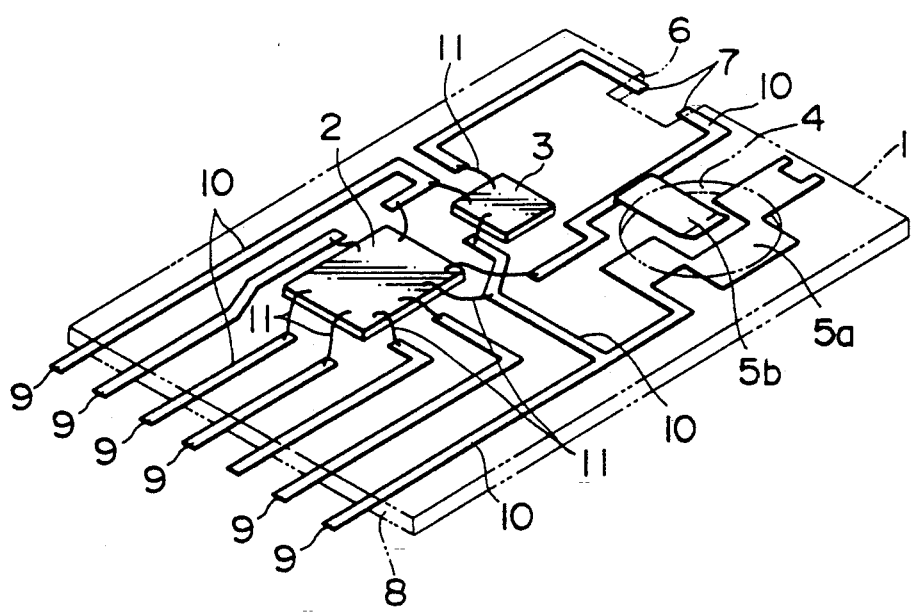
FIG. 2 is a perspective view of the embodiment of FIG. 1 as it is shorn of the -plastic that seals the components thereof.
Figure 3:
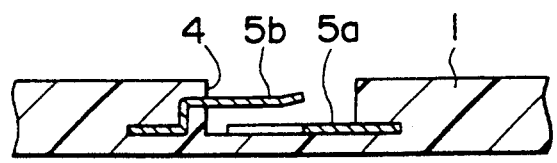
FIG. 3 is an enlarlued cross-sectional view of a battery holding portion of the embodiment.
Figure 4:
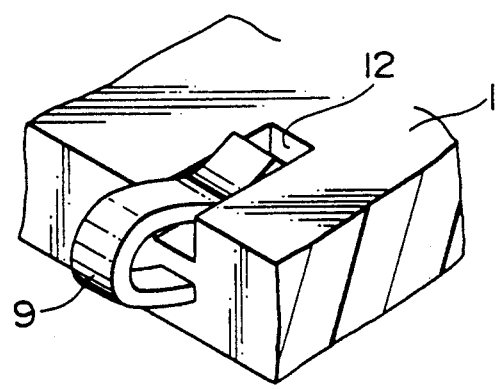
FIG. 4 is an enlarged perspective view of a connector terminal that belongs to the embodiment.

A Preferred embodiment of the invention will now be described in detail with reference to the accompanying drawings. The drawings depict an IC card embodying the invention. FIG. 1 is a perspective view showing the embodiment in its entirety. FIG. 2 is a perspective view that illustrates the embodiment without the plastic sealing the components thereof (.two-dot chain lines indicate where the plastic should be when in place). FIG. 3 is an enlarged cross-sectional view of a battery holding portion of the embodiment. FIG. 4 is an enlaroed perspective illustration of one of the connector terminals belonging to thie embodiment.

In the figures, reference numeral 1 is a rectangular piece of plastic that seals a semiconductor storage device 2 and a semiconductor control device 3. Part of the plastic 2 is set aside as a bottomed battery accommodating hole 4. A pair of battery terminals 5a and 5b are left exposed on the inner circumference of the hole 4. The battery terminal 5b is elevated over the terminal 5a to provide a gap therebetween. A coin type battery is placed in the gap between the terminals 5a and 5b.

From a notch 6 protrude write protect control terminals 7. Write protection is activated or deactivated deperiding on whether or not the terminals 7 are short-circuited. A connector terminal end face 8 has connector terminals 9 of the plastic 1 projected therefrom. Lead wires 10 constitute the terminals 5a, 5b, 7, 9, etc.

The lead wires 10 make up part of a lead frame before unnecessary portions are cut off the wires following the sealing by ttte plastic 1. The lead frame integrally constitutes the lead wires 10 of a plurality of IC cards. From the lead frame, the lead wires are punched or etched into existence. The battery terminal 5b is raised by a depressing process after the lead wires are formed from the lead frame.

Each of the connector terminals 9 protruding from the connector terminal end face 8 is bent in a U-shape. The tip of the terminal is brought inside a thin notch 12, as depicted in FIG. 4. In FIG. 2, however, the connector terminals 9 are shown unbent. Connecting wires 11 connect the inner ends of the lead wires 10 to the electrode pads of the semiconductor storaee device 2 and semiconductor control device 3.

In this IC card, a lead frame with no die pad keeps the connecting wires 11 in place. The connecting wires 11 in turn hold in place the semiconductor storage device 2 and semiconductor control device 3, the electrodes of the devices being connected by the wires 11 to the inner ends of the lead wires 10. In this state, the whole assembly is sealed in the plastic 1.

Alternatively, the semiconductor storage device 2 and semiconductor control device 3 may also be connected to the inner ends of the lead wires 10 using tab tape or by face-down bonding. Three or more semiconductor IC chips may also be mounted on the board.

The IC card embodying the invention as described is assembled in the same number of assembling steps using the same number of parts as one IC. This type of IC card entails far lower cost than conventionally manufactured IC cards. Where a plurality of IC chips, a lead frame, wires (or tab tape) and a piece of plastic are prepared, the IC chips are connected by wire bondinu (or throuch tab lead connection) and are sealed by the plastic. There is no need to attach connectors or to incorporate into a case the semiconductor storage and control devices mounted on a board. The resultiny reductions in manufacturing cost are considerable.

Specifically, the plastic 1 that seals the semiconductor storage device 2 and semiconductor control device 3 constitutes in itself the enclosure of an IC card, with no extra case required. Thus the IC card may be as thin as ordiriary plastic-sealed IC's. Because the thickness of the sealing plastic 1 is identical to that of a finished IC card, this type of IC card is made significantly thinner than prior art IC cards that incorporate into a casing the circuit board that comprises semiconductor storage and control devices. The IC card accordinz to the invention is readily made as thin as credit cards (0.7 to 0.8 mm in thickness).

Unlike the sealing plastic for potting, the plastic for sealing according to the invention has high mechanical strength and is resistant to partial stress concentration. Without the need for reflow soldering, there is no possibitity of cracks developino in the plastic as a result of expansion of the moisture therewithin. This provides hich quality IC cards of high reliability.

As described above, the invention offers an IC card comprising a plurality of semiconductor IC chips and a plura-Lity of lead wires acting as external terminals, the chips and the lead wires beincl integrally sealed in a plastic board. The inventive IC card is assembled in the same processes usino the same parts as ordinary plastic-sealed semiconductor IC's. With no need for the casing or for connectors, the number of parts and that of assembling steps are considerably smaller for the inventive IC card than for prior art IC cards. This amounts to siinificant savings in the manufacturing cost of IC cards.

Because the thickness of the plastic that seals the multiple semiconductor IC chips is identical to that of a finished IC card, this type of IC card is made as thin as ordinary plastic-sealed semiconductor IC's. Thus the inventiive IC card is made significantly thinner than prior art IC cards that incorporate into a casing the circuit board that comprises semiconductor storage and control devices.

The plastic for sealing according to the invention has high mechanical strength. With no need for reflow soldering, there is no possibility of cracks developing in the plastic as a restilt of heat treatment. This ensures the production of high quality IC cards with high reliability.

As many apparently different embodiments of this invention may be made without departing from the spirit and scope thereof, it is to be understood that the invention is not limited to the specific embodiments thereof except as defined in the appended claims.

What is claimed is:

1. An integrated circuit card comprising:
    a plurality of semiconductor integrated circuit chips each having a plurality of electrodes; and
    a plurality of lead wires acting as the terminals for connecting the electrodes of said semiconductor integrated circuit chips to the outside;
    wherein said semiconductor integrated circuit chips and said lead wires are integrally sealed, without any subbases or substrated, in a plastic board.

2. An integrated circuit card according to claim 1, wherein said lead wires further include discrete wires connected to the electrodes of said integrated circuit chips.

3. An integrated circuit card accordign to claim 2, wherein each of the discrete wires has a first end and a second end, and wherein the first end of each of the discrete wires is directly attached to one of the electrtodes by a wire bonding process.

* * * * *